(12) United States Patent
Kouchi et al.

(10) Patent No.: US 8,159,852 B2
(45) Date of Patent: Apr. 17, 2012

(54) SEMICONDUCTOR MEMORY DEVICE

(75) Inventors: Toshiyuki Kouchi, Tokyo (JP); Yutaka Tanaka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 430 days.

(21) Appl. No.: 12/398,839

(22) Filed: Mar. 5, 2009

(65) Prior Publication Data
US 2009/0268499 A1     Oct. 29, 2009

(30) Foreign Application Priority Data

Apr. 23, 2008 (JP) ................................. 2008-112594
Oct. 3, 2008 (JP) ................................. 2008-258034

(51) Int. Cl.
*G11C 5/02* (2006.01)

(52) U.S. Cl. .................... 365/51; 365/63; 365/185.25

(58) Field of Classification Search .................... 365/51, 365/63, 185.25, 230.05, 154, 189.15, 201
See application file for complete search history.

(56) References Cited

U.S. PATENT DOCUMENTS

| | | | | |
|---|---|---|---|---|
| 7,405,994 | B2* | 7/2008 | Liaw | 365/230.05 |
| 7,495,948 | B2* | 2/2009 | Suzuki et al. | 365/154 |
| 2008/0151653 | A1* | 6/2008 | Ishikura et al. | 365/189.15 |
| 2009/0052262 | A1* | 2/2009 | Nii | 365/189.14 |

FOREIGN PATENT DOCUMENTS

| | | |
|---|---|---|
| JP | H07-022590 A | 1/1995 |
| JP | H08-097298 A | 4/1996 |
| JP | 2000-031297 A | 1/2000 |
| JP | 2005-025863 A | 1/2005 |

OTHER PUBLICATIONS

Explanation of Non-English Language Reference(s).

* cited by examiner

*Primary Examiner* — Dang Nguyen
(74) *Attorney, Agent, or Firm* — Knobbe, Martens, Olson & Bear LLP

(57) ABSTRACT

A semiconductor memory device includes first and second driving transistors; first and second load transistors; and first and second transmission transistors. Their respective drain diffusion layers of the transistors are isolated from one another. The semiconductor memory device also includes a bit cell in which the first and second driving transistors, the first and second load transistors, and the first and second transmission transistors are arranged; a first wiring for connecting their respective drains of the first driving transistor, the first load transistor, and the first transmission transistor; and a second wiring for connecting their respective drains of the second driving transistor, the second load transistor, and the second transmission transistor.

21 Claims, 9 Drawing Sheets

SEMICONDUCTOR MEMORY DEVICE

CROSS-REFERENCE TO RELATED APPLICATIONS

This application is based upon and claims the benefit of priority from the prior Japanese Patent Applications No. 2008-112594, filed on Apr. 23, 2008 and Japanese Patent Application No. 2008-258034, filed on Oct. 3, 2008, the entire contents of both of which are incorporated herein by reference.

BACKGROUND OF THE INVENTION

1. Field of the Invention

The present invention relates to a semiconductor memory device, and, more particularly to a semiconductor memory device suitable for a layout method of bit cells of a dual-port (2-port) SRAM.

2. Description of the Related Art

Recently, static random access memory (SRAM) has been widely used in computer cache memories and portable electronic products, because any refresh operation is not required in the SRAM, and thus less power is consumed and an operation speed is faster as compared to dynamic random access memory (DRAM). Bit cells used in SRAMs are of two types, i.e., high-resistance cells and complementary metal oxide semiconductor (CMOS) cells. CMOS cells are configured by a pair of transmission transistors, a pair of driving transistors, and a pair of load transistors (for example, see JP-A 2000-31297 (KOKAI)).

In a system-on-chip used for image processing communication processing or the like, there is a demand for mounting a dual-port SRAM that can be accessed simultaneously from both A and B ports for the purpose of increasing the speed of the processing. This dual-port SRAM is realized by further adding a pair of transmission transistors to the bit cells of a single-port SRAM.

For example, JP-A 2005-25863 (KOKAI) discloses a method for serving both purposes of data maintenance stability and writing margins for a 2-port SRAM that includes a latch circuit that complementarily maintains potentials in storage nodes, access transistors each distributed between the storage nodes and bit lines, and turned on in response to activation of word lines, write access transistors and storage level driving transistors each arranged between the storage node and a ground potential, the write access transistors being turned on in response to activation of the word lines and the storage level driving transistors being turned on in response to sub bit lines, and write access transistors that are turned on in response to the activation of the word lines and storage level driving transistors that are turned on in response to the sub bit lines.

However, in bit cells of a conventional dual-port SRAM, a pair of load transistors are positioned adjacent to each other in the horizontal direction, and in this state, while transmission transistors for different ports are positioned adjacent to each other in the horizontal direction, two transmission transistors each are aligned on either side of the load transistor (four transmission transistors in total). Thus, besides the fact that the vertical-to-horizontal aspect of the bit cells becomes about 1:4, and the length of the word line wired in the horizontal direction becomes longer, the width also becomes thinner. As a result, the resistance of the word line rises. Consequently, rising inclination of a word-line potential becomes smoother and the maximum frequency at the time of incorporating bit cells in a macro manner is controlled by the rising inclination of the word-line potential, and thus there is a problem that the operation speed of the SRAM is reduced.

In the bit cells of a conventional dual-port SRAM, the transmission transistors for different ports are positioned adjacent to each other in the horizontal direction, and thus the bit lines for different ports are also positioned adjacently. As a result, there is also a problem that the parity of bit lines is lost, and a variation in a static noise margin of bit cells increases.

Although it is possible to simultaneously write and read in the conventional dual-port SRAMs, only two word lines are distributed in each bit cell, and thus there is also a problem that it is not possible to simultaneously write one set of data and read the data with two read ports.

BRIEF SUMMARY OF THE INVENTION

A semiconductor memory device according to an embodiment of the present invention comprises: a first driving transistor having a diffusion layer serving as a drain of the first driving transistor; a second driving transistor having a diffusion layer serving as a drain of the second driving transistor; a first load transistor having a diffusion layer serving as a drain of the first load transistor; a second load transistor having a diffusion layer serving as a drain of the second load transistor; a first transmission transistor having a diffusion layer serving as a drain of the first transmission transistor; a second transmission transistor having a diffusion layer serving as a drain of the second transmission transistor, wherein the diffusion layer of the first driving transistor, the diffusion layer of the second driving transistor, the diffusion layer of the first load transistor, the diffusion layer of the second load transistor, the diffusion layer of the first transmission transistor, the diffusion layer of the second transmission transistor are isolated from one another, wherein the first and second driving transistors, the first and second load transistors, and the first and second transmission transistors are arranged in a bit cell; a first wiring for connecting the drain of the first driving transistor, the drain of the first load transistor, and the drain of the first transmission transistor; and a second wiring for connecting the drain of the second driving transistor, the drain of the second load transistor, and the drain of the second transmission transistor.

A semiconductor memory device according to an embodiment of the present invention comprises: a first driving transistor; a second driving transistor; a first load transistor connected in series to the first driving transistor; a second load transistor connected in series to the second driving transistor; a first transmission transistor of which a drain is connected to a gate of the first driving transistor, a gate of the first load transistor, a drain of the second driving transistor, and a drain of the second load transistor; a second transmission transistor of which a drain is connected to a drain of the first driving transistor, a drain of the first load transistor, a gate of the second driving transistor, and a gate of the second load transistor; a first read-only driving transistor of which a gate is connected to the gate of the first driving transistor, the gate of the first load transistor, the drain of the second driving transistor, and the drain of the second load transistor; a second read-only driving transistor of which a gate is connected to the drain of the first driving transistor, the drain of the first load transistor, the gate of the second driving transistor, and the gate of the second load transistor; a first read-only transmission transistor of which a drain is connected to the drain of the first read-only driving transistor; a second read-only transmission transistor of which a drain is connected to the drain of the second read-only driving transistor; a writing word line connected to the gate of the first transmission transistor and the gate of the second transmission transistor; a first reading word line connected to the gate of the first read-only transmission transistor; a second reading word line connected to the gate of the second read-only transmission transistor; a first writing bit line connected to a source of the first transmission transistor; a second writing bit line connected to a source of the second transmission transistor; a first reading bit line connected to a source of the first read-only transmission transistor; and a second reading bit line connected to a source of the second read-only transmission transistor.

A semiconductor memory device according to an embodiment of the present invention comprises: a first driving transistor; a second driving transistor; a first load transistor connected in series to the first driving transistor; a second load transistor connected in series to the second driving transistor; a first transmission transistor of which a drain is connected to a gate of the first driving transistor, a gate of the first load transistor, a drain of the second driving transistor, and a drain of the second load transistor; a second transmission transistor of which a drain is connected to a drain of the first driving transistor, a drain of the first load transistor, a gate of the second driving transistor, and a gate of the second load transistor; a first read-only transmission transistor of which a drain is connected to the gate of the first driving transistor, the gate of the first load transistor, the drain of the second driving transistor, and the drain of the second load transistor; a second read-only transmission transistor of which a drain is connected to the drain of the first driving transistor, the drain of the first load transistor, the gate of the second driving transistor, and the gate of the second load transistor; a writing word line connected to the gate of the first transmission transistor and the gate of the second transmission transistor; a first reading word line connected to the gate of the first read-only transmission transistor; a second reading word line connected to the gate of the second read-only transmission transistor; a first writing bit line connected to a source of the first transmission transistor; a second writing bit line connected to a source of the second transmission transistor; a first reading bit line connected to a source of the first read-only transmission transistor; and a second reading bit line connected to a source of the second read-only transmission transistor.

DETAILED DESCRIPTION OF THE INVENTION

Exemplary embodiments of a semiconductor memory device according to the present invention will be explained below in detail with reference to the accompanying drawings.

Figure 1:
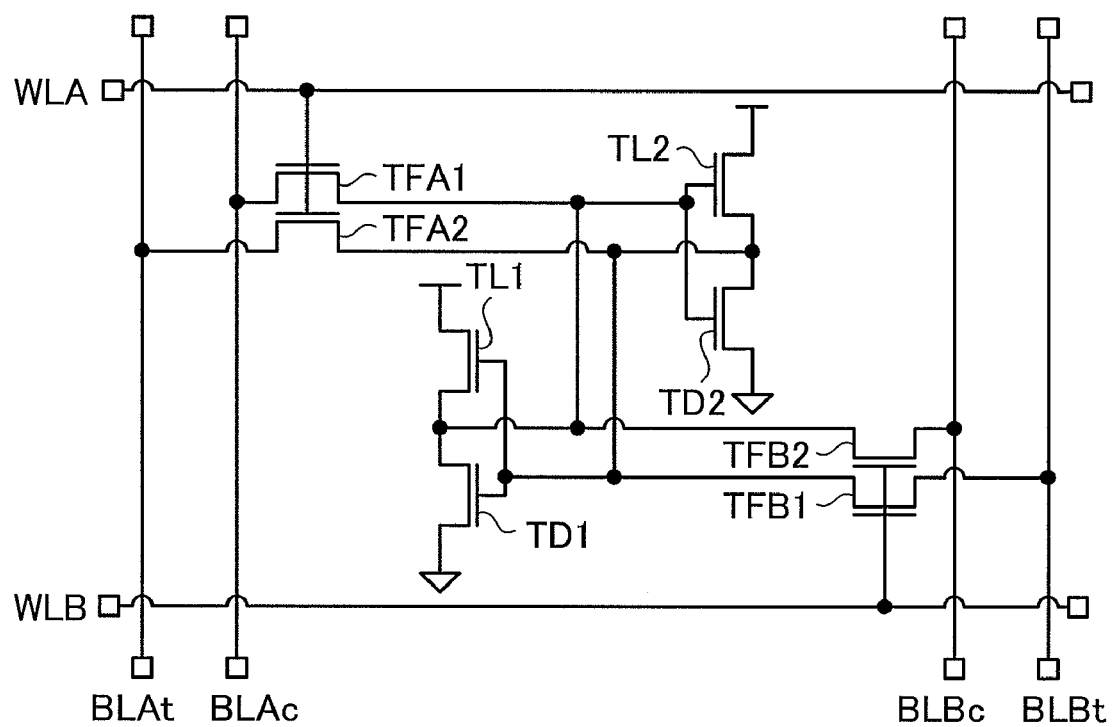
FIG. 1 depicts a circuit configuration of a bit cell of a dual port SRAM according to a first embodiment of the present invention.

FIG. 1 depicts a circuit configuration of a bit cell of a dual port SRAM according to a first embodiment of the present invention.

In FIG. 1, a pair of driving transistors TD1 and TD2, a pair of load transistors TL1 and TL2, a pair of transmission transistors TFA1 and TFA2 for an A port, and a pair of transmission transistors TFB1 and TFB2 for a B port are arranged in the bit cells. P-channel field effect transistors can be used for the load transistors TL1 and TL2 while N-channel field effect transistors can be used for the driving transistors TD1 and TD2, the transmission transistors TFA1 and TFA2 for an A port, and the transmission transistors TFB1 and TFB2 for a B port.

One CMOS inverter is configured by connecting the driving transistor TD1 and the load transistor TL1 to each other in a series, while the other CMOS inverter is configured by connecting the driving transistor TD2 and the load transistor TL2 to each other in a series. A flip-flop is configured by cross-coupling output and input of the pair of CMOS inverters to each other.

A word line WLA for an A port is connected to gates of the transmission transistors TFA1 and TFA2 for an A port, and a word line WLB for a B port is connected to gates of the transmission transistors TFB1 and TFB2 for a B port.

A bit line BLAc for an A port is connected via the transmission transistor TFA1 for an A port to a gate of the driving transistor TD2, a gate of the load transistor TL2, a drain of the driving transistor TD1, and a drain of the load transistor TL1. The bit line BLAt for an A port is connected via the transmission transistor TFA2 for an A port to a drain of the driving transistor TD2, a drain of the load transistor TL2, a gate of the driving transistor TD1, and a gate of the load transistor TL1.

The bit line BLBc for a B port is connected via the transmission transistor TFB1 for a B port to a gate of the driving transistor TD1, a gate of the load transistor TL1, a drain of the driving transistor TD2, and a drain of the load transistor TL2. The bit line BLBt for a B port is connected via the transmission transistor TFB2 for a B port to a drain of the driving transistor TD1, a drain of the load transistor TL1, a gate of the driving transistor TD2, and a gate of the load transistor TL2.

When accessing the bit cell from an A port, the bit cell can be selected by operating the transmission transistors TFA1 and TFA2 for an A port via the word line WLA for an A port and the bit lines BLAc and BLAt for an A port. When accessing the bit cell from a B port, the bit cell can be selected by operating the transmission transistors TFB1 and TFB2 for a B port via the word line WLB for a B port and the bit lines BLBc and BLBt for a B port.

The transmission transistors TFA1 and TFA2 for an A port can be adjacent to each other and positioned on one end of the bit cell, and also, the transmission transistors TFB1 and TFB2 for a B port can be adjacent to each other and positioned on the other end of the bit cell. Gate electrodes of the transmission transistors TFA1 and TFA2 for an A port can be shared, and the bit lines BLAc and BLAt for an A port can be positioned adjacent to each other. Gate electrodes of the transmission transistors TFB1 and TFB2 for a B port can be shared, and the bit lines BLBc and BLBt for a B port can be positioned adjacent to each other.

Figure 2:
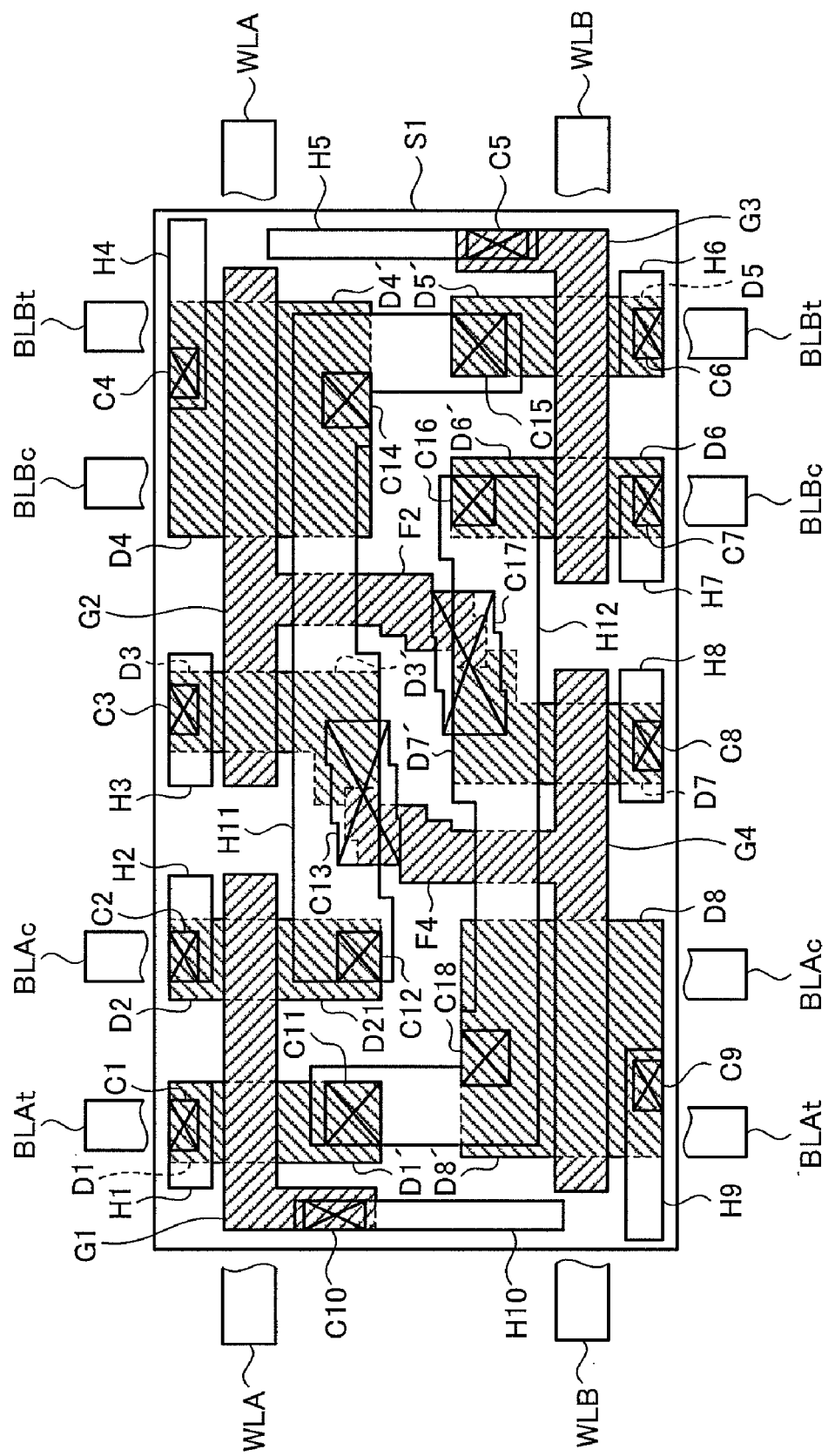
FIG. 2 is a plan view of a schematic configuration of a bit cell of the dual port SRAM according to the first embodiment.

FIG. 2 is a plan view of a schematic configuration of a bit cell of the dual port SRAM according to the first embodiment.

In FIG. 2, on a semiconductor substrate S1, gate electrodes G1 to G4 are positioned. The gate electrodes G1 and G2 are aligned in the horizontal direction, and at the same time, the gate electrodes G3 and G4 are also aligned in the horizontal direction. The gate electrodes G1 and G2 and the gate electrodes G3 and G4 are aligned in the vertical direction so that the both gate electrodes form rotational symmetry to each other.

The transmission transistor TFA1 for an A port in FIG. 1 is configured by forming diffusion layers D1 and D1' on the semiconductor substrate S1 such that each diffusion layer is positioned on either side of the gate electrode G1. The transmission transistor TFA2 for an A port in FIG. 1 is configured by forming diffusion layers D2 and D2' on the semiconductor substrate S1 such that each diffusion layer is positioned on either side of the gate electrode G1. The diffusion layers D1 and D1' and the diffusion layers D2 and D2' are aligned in the horizontal direction, and the gate electrode G1 is shared between the diffusion layers D1 and D1' and the diffusion layers D2 and D2'.

The load transistor TL1 in FIG. 1 is configured by forming diffusion layers D3 and D3' on the semiconductor substrate S1 such that each diffusion layer is positioned on either side of the gate electrode G2. The driving transistor TD1 in FIG. 1 is configured by forming diffusion layers D4 and D4' on the semiconductor substrate S1 such that each diffusion layer is positioned on either side of the gate electrode G2. The diffusion layers D3 and D3' and the diffusion layers D4 and D4' are aligned in the horizontal direction, and the gate electrode G2 is shared between the diffusion layers D3 and D3' and the diffusion layers D4 and D4'.

The transmission transistor TFB1 for a B port in FIG. 1 is configured by forming diffusion layers D5 and D5' on the semiconductor substrate S1 such that each diffusion layer is positioned on either side of the gate electrode G3. The transmission transistor TFB2 for a B port in FIG. 1 is configured by forming diffusion layers D6 and D6' on the semiconductor substrate S1 such that each diffusion layer is positioned on either side of the gate electrode G3. The diffusion layers D5 and D5' and the diffusion layers D6 and D6' are aligned in the horizontal direction, and the gate electrode G3 is shared between the diffusion layers D5 and D5' and the diffusion layers D6 and D6'.

The load transistor TL2 in FIG. 1 is configured by forming diffusion layers D7 and D7' on the semiconductor substrate S1 such that each diffusion layer is positioned on either side of the gate electrode G4. The driving transistor TD2 in FIG. 1 is configured by forming diffusion layers D8 and D8' on the semiconductor substrate S1 such that each diffusion layer is positioned on either side of the gate electrode G4. The diffusion layers D7 and D7' and the diffusion layers D8 and D8' are aligned in the horizontal direction, and the gate electrode G4 is shared between the diffusion layers D7 and D7' and the diffusion layers D8 and D8'.

The diffusion layers D1 and D1' to the diffusion layers D8 and D8' are isolated on the semiconductor substrate S1 from one another via an element isolation region. For example, both a shallow trench isolation (STI) structure and a local oxidation of silicon (LOCOS) structure can be used as the element isolation region.

Wirings H1 to H12 are formed on the gate electrodes G1 to G4, the bit lines BLAc and BLAt for an A port and the bit lines BLBc and BLBt for a B port are formed on the wirings H1 to H12, and the word line WLA for an A port and the word line WLB for a B port are formed on the bit lines BLAc and BLAt for an A port and the bit lines BLBc and BLBt for a B port. Wirings H1 to H12 can be used as a first wiring layer, the bit lines BLAc and BLAt for an A port and the bit lines BLBc and BLBt for a B port can be used as a second wiring layer, and the word line WLA for an A port and the word line WLB for a B port can be used as a third wiring layer.

The bit lines BLAc and BLAt for an A port and the bit lines BLBc and BLBt for a B port are aligned in the vertical direction while the word line WLA for an A port and the word line WLB for a B port are aligned in the horizontal direction. The bit lines BLAc and BLAt for an A port are positioned adjacent to each other, and the bit lines BLBc and BLBt for a B port are also positioned adjacent to each other.

The diffusion layer D1 is connected to the wiring H1 via a contact C1, the diffusion layer D2 is connected to the wiring H2 via a contact C2, the diffusion layer D3 is connected to the wiring H3 via a contact C3, the diffusion layer D4 is connected to the wiring H4 via a contact C4, the diffusion layer D5 is connected to the wiring H6 via a contact C6, the diffusion layer D6 is connected to the wiring H7 via a contact C7, the diffusion layer D7 is connected to the wiring H8 via a contact C8, and the diffusion layer D8 is connected to the wiring H9 via a contact C9. The gate electrode G1 is connected to the wiring H10 via a contact C10, and the gate electrode G3 is connected to the wiring H5 via a contact C5.

The diffusion layer D2' is connected to the diffusion layer D4' via a contact C12, a wiring H11, and a contact C14, and at the same time, it is connected to the diffusion layer D5' via the contact C12, the wiring H11, and the contact C15. The diffusion layer D6' is connected to the diffusion layer D8' via a contact C16, a wiring H12, and a contact C18, and at the same time, it is connected to the diffusion layer D1' via the contact C12, the wiring H11, and the contact C11.

An extraction electrode F2 extends from the gate electrode G2 is positioned between the diffusion layer D3' and the diffusion layer D4', and the extraction electrode F2 is positioned on the semiconductor substrate S1 after passing it under the wiring H11. The extraction electrode F2 is connected to the diffusion layer D7' via a contact C17. An extraction electrode F4 extends from the gate electrode G4 is positioned between the diffusion layer D7' and the diffusion layer D8', and the extraction electrode F4 is positioned on the semiconductor substrate S1 after passing it under the wiring H12. The extraction electrode F4 is connected to the diffusion layer D3' via a contact C13.

The contacts C1 to C17 can use embedded contacts in which conductors are embedded within the contacts C1 to C17. The embedded contacts can be collectively formed together with the wirings H1 to H12 by a dual damascene method or the like.

The bit line BLAc for an A port is connected to the diffusion layer D2 while the bit line BLAt for the A port is connected to the diffusion layer D1. The bit line BLBc for a B port is connected to the diffusion layer D6 while the bit line BLBt for the B port is connected to the diffusion layer D5. The word line WLA for the A port is connected to the gate electrodes G1 and G2 while the word line WLB for the B port is connected to the gate electrodes G3 and G4.

A high potential power-supply line VDD and a low potential power-supply line VSS can be positioned to be orthogonal to wiring layers different to each other. For example, the high potential power-supply line VDD can be formed in the horizontal direction in the third wiring layer used for the formation of the word line WLA for an A port and word line WLB for a B port. At the same time, the low potential power-supply line VSS can be formed in the vertical direction in the second wiring layer used for the formation of the bit lines BLAc and BLAt for an A port and bit lines BLBc and BLBt for a B port.

The bit lines BLAc and BLAt for an A port can be positioned adjacent to each other by positioning the diffusion layers D1 and D1' and the diffusion layers D2 and D2' adjacent to each other. At the same time, the bit lines BLBc and BLBt for a B port can be positioned adjacent to each other by positioning the diffusion layers D5 and D5' and the diffusion layers D6 and D6' adjacent to each other. Thus, the bit lines for the same port can be positioned adjacent to each other, and thereby the parities of the bit lines BLAc and BLAt for an A port with the bit lines BLBc and BLBt for a B port can be maintained, respectively. As a result, a variation in the line width and capacitance between the bit lines for the same port can be decreased, and a variation in the static noise margin of bit cells can also be decreased.

By isolating the diffusion layers D1 and D1' to the diffusion layers D8 and D8' on the semiconductor substrate S1 to one another, and connecting the diffusion layers D2' and D5' with the wiring H11, and at the same time, connecting the diffusion layers D1' and D6' with the wiring H12, the shape of an active region of the transmission transistors TFA1 and TFA2 for an A port can be matched and an STI stress dependability can be increased, and at the same time, the shape of an active region of the transmission transistors TFB1 and TFB2 for a B port can be matched and an STI stress dependability can be increased. Thus, a variation in the STI stress dependability between the transmission transistors for the same port can be decreased, and a threshold value voltage Vth according to the STI stress dependability can be raised, and thus the disturb feature (durability against erroneous rewriting) of the bit cell can be improved.

By sharing the gate electrode G1 between the diffusion layers D1 and D1' and the diffusion layers D2 and D2', and by sharing the gate electrode G3 between the diffusion layers D5 and D5' and the diffusion layers D6 and D6', the number of times of a bumping frequency of the gate electrode can be decreased from 2.5 to 1.5 as compared to a case that individual gate electrodes are arranged, and at the same time, the number of gate contacts can be reduced. Thus, the horizontal width of the bit cell can be shortened, and the vertical-to-horizontal aspect of the bit cell can be changed from about 1:4 to about 1:2, and as a result, the disproportion of the vertical-to-horizontal aspect of the bit cells can be decreased. As a result, the length of the word line WLA for an A port and the word line WLB for a B port can be shortened, and the resistance of the word line WLA for an A port and the word line WLB for a B port can be reduced. Thus, rising inclination of a potential of the word line WLA for an A port and the word line WLB for a B port can be made steeper, and the operation speed of SRAM can be improved.

By changing the vertical-to-horizontal aspect of the bit cell to about 1:2, the vertical width of the bit cell can be increased, the high potential power-supply line VDD can be formed in the horizontal direction in the third wiring layer used for forming the word line WLA for an A port and the the word line WLB for a B port, and at the same time, the low potential power-supply line VSS can be formed in the vertical direction in the second wiring layer used for forming the bit lines BLAc and BLAt for an A port and the bit lines BLBc and BLBt for a B port. Thus, the decline in the potential of the high potential power-supply line VDD and the low potential power-supply line VSS can be inhibited.

In the first embodiment, the dual port SRAM is used as an example. However, the first embodiment can be also applied to a single-port SRAM. When applying to the single-port SRAM, the transmission transistors TFA1 and TFA2 for an A port, the bit lines BLAc and BLAt for an A port, and the the word line WLA for an A port in FIG. 1 can be deleted from the layout in FIG. 2.

Figure 3:
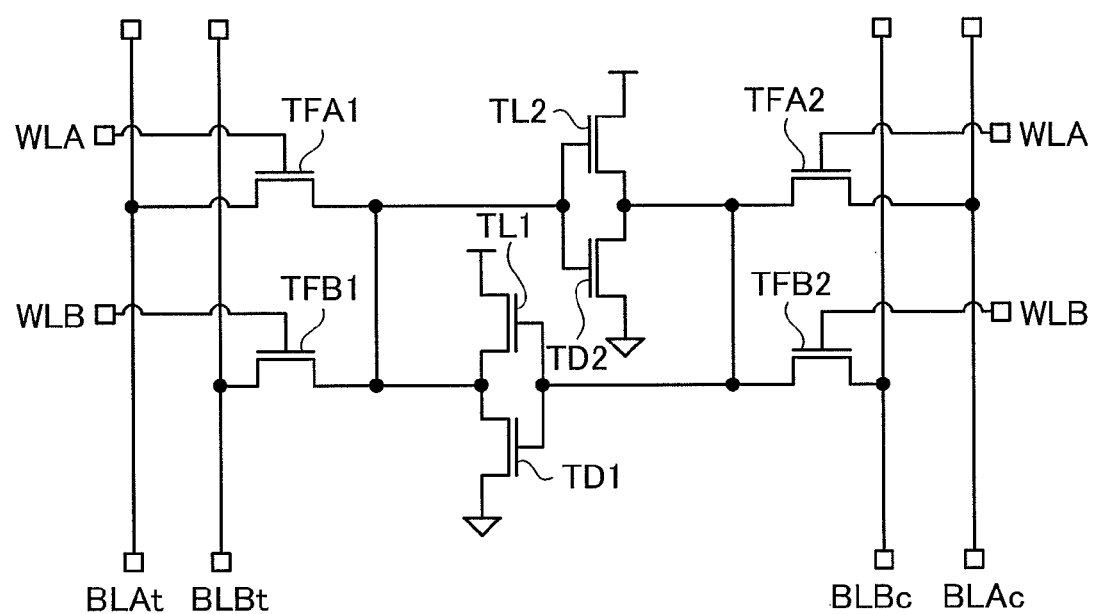
FIG. 3 depicts a circuit configuration of a bit cell of a dual port SRAM according to a second embodiment of the present invention.

FIG. 3 depicts a circuit configuration of a bit cell of a dual port SRAM according to a second embodiment of the present invention.

In FIG. 3, the configuration elements and the connection relationship of a circuit of the bit cell are similar to those of the bit cell in FIG. 1. However, in the bit cell in FIG. 1, the transmission transistors TFA1 and TFA2 for an A port are positioned adjacent to each other, and at the same time, the transmission transistors TFB1 and TFB2 for a B port are positioned adjacent to each other. By contrast, in the bit cell in FIG. 3, the transmission transistor TFA1 for an A port and the transmission transistor TFB1 for a B port are positioned adjacent to each other, and at the same time, the transmission transistor TFA2 for an A port and the transmission transistor TFB2 for a B port are positioned adjacent to each other.

In the bit cell in FIG. 1, the bit lines BLAc and BLAt for an A port are positioned adjacent to each other, and at the same time, the bit lines BLBc and BLBt for a B port are positioned adjacent to each other. By contrast, in the bit cell in FIG. 3, the bit line BLAc for an A port and the bit line BLBc for a B port are positioned adjacent to each other, and at the same time, the bit line BLAt for an A port and the bit line BLBt for a B port are positioned adjacent to each other.

Figure 4:
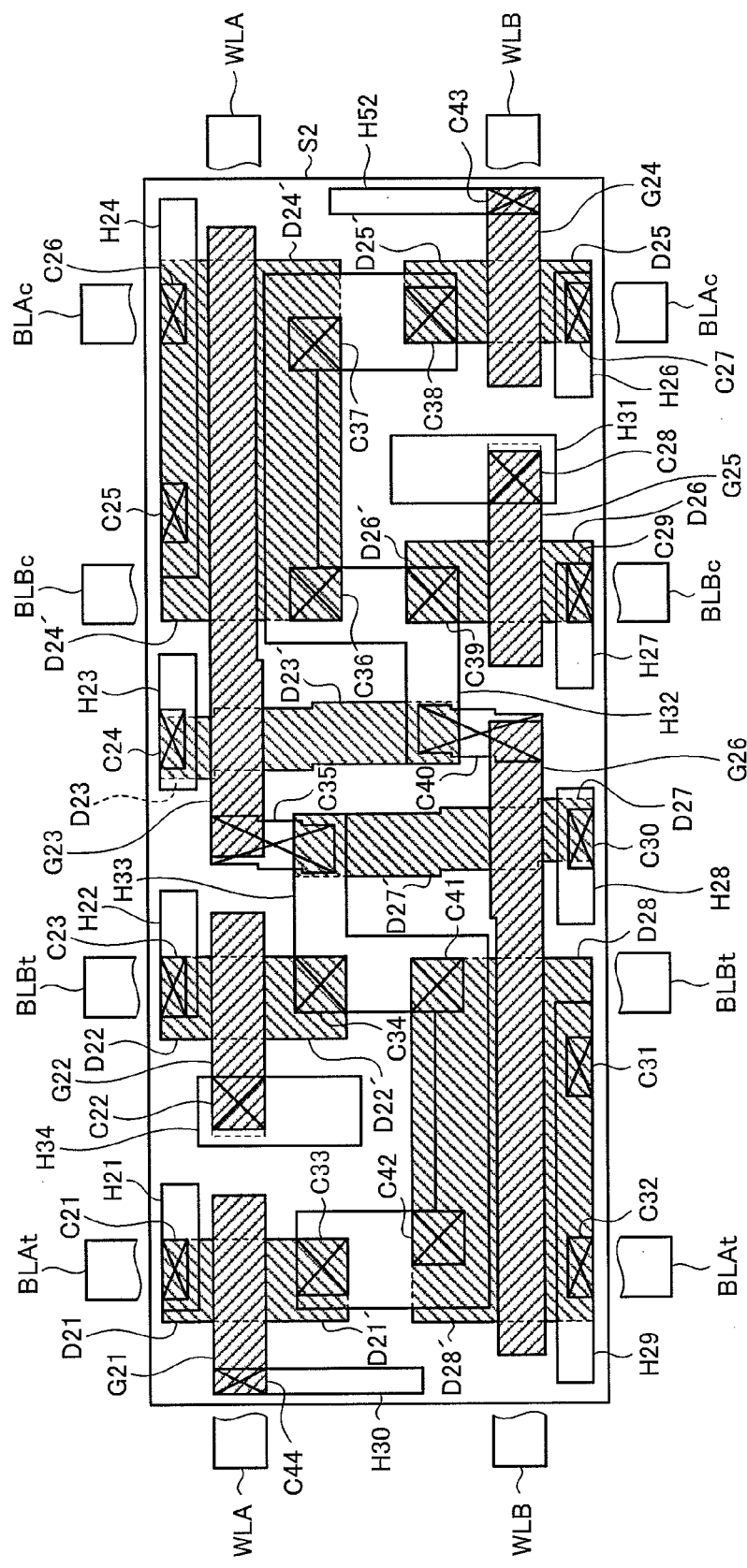
FIG. 4 is a plan view of a schematic configuration of a bit cell of the dual port SRAM according to the second embodiment.

FIG. 4 is a plan view of a schematic configuration of a bit cell of the dual port SRAM according to the second embodiment.

In FIG. 4, on a semiconductor substrate S2, gate electrodes G21 to G26 are positioned. The gate electrodes G21 to G23 are aligned in the horizontal direction, and at the same time, the gate electrodes G24 to G26 are also aligned in the horizontal direction. The gate electrodes G21 to G23 and the gate electrodes G24 to G26 are aligned in the vertical direction so that the both gate electrodes form rotational symmetry to each other.

The transmission transistor TFA1 for an A port in FIG. 3 is configured by forming the diffusion layers D21 and D21' on the semiconductor substrate S2 such that each diffusion layer is positioned on either side of the gate electrode G21. The transmission transistor TFB1 for a B port in FIG. 3 is configured by forming the diffusion layers D22 and D22' on the semiconductor substrate S2 such that each diffusion layer is positioned on either side of the gate electrode G21. The diffusion layers D21 and D21' and the diffusion layers D22 and D22' are aligned in the horizontal direction, and the gate electrodes G21 and G22 are arranged separately for the diffusion layers D21 and D21' and the diffusion layers D22 and D22', respectively.

The load transistor TL2 in FIG. 3 is configured by forming the diffusion layers D23 and D23' on the semiconductor substrate S2 such that each diffusion layer is positioned on either side of the gate electrode G23. The driving transistor TD2 in FIG. 3 is configured by forming the diffusion layers D24 and D24' on the semiconductor substrate S2 such that each diffusion layer is positioned on either side of the gate electrode G23. The diffusion layers D23 and D23' and the diffusion layers D24 and D24' are aligned in the horizontal direction, and the gate electrode G23 is shared between the diffusion layers D23 and D23' and the diffusion layers D24 and D24'.

The transmission transistor TFA2 for an A port in FIG. 3 is configured by forming the diffusion layers D25 and D25' on the semiconductor substrate S2 such that each diffusion layer is positioned on either side of the gate electrode G24. The transmission transistor TFB2 for a B port in FIG. 3 is configured by forming the diffusion layers D26 and D26' on the semiconductor substrate S2 such that each diffusion layer is positioned on either side of the gate electrode G25. The diffusion layers D25 and D25' and the diffusion layers D26 and D26' are aligned in the horizontal direction, and the gate electrodes G24 and G25 are arranged separately for the diffusion layers D25 and D25' and the diffusion layers D26 and D26', respectively.

The load transistor TL1 in FIG. 3 is configured by forming the diffusion layers D27 and D27' on the semiconductor substrate S2 such that each diffusion layer is positioned on either side of the gate electrode G26. The driving transistor TD1 in FIG. 3 is configured by forming the diffusion layers D28 and D28' on the semiconductor substrate S2 such that each diffusion layer is positioned on either side of the gate electrode G26. The diffusion layers D27 and D27' and the diffusion layers D28 and D28' are aligned in the horizontal direction, and the gate electrode G26 is shared between the diffusion layers D27 and D27' and the diffusion layers D28 and D28'.

The diffusion layers D21 and D21' to the diffusion layers D28 and D28' are isolated from one another on the semiconductor substrate S2 via an element isolation region. For the element isolation region, either an STI structure or a LOCOS structure can be used, for example.

Wirings H21 to H34 are formed on the gate electrodes G21 to G26, the bit lines BLAc and BLAt for an A port and the bit lines BLBc and BLBt for a B port are formed on the wirings H21 to H34, the word line WLA for an A port and the word line WLB for a B port are formed on the bit lines BLAc and BLAt for an A port and the bit lines BLBc and BLBt for a B port. The wirings H21 to H34 can be used as the first wiring layer, the bit lines BLAc and BLAt for an A port and the bit lines BLBc and BLBt for a B port can be used as the second wiring layer, and the word line WLA for an A port and the word line WLB for a B port can be used as the third wiring layer.

The bit lines BLAc and BLAt for an A port and the bit lines BLBc and BLBt for a B port are aligned in the vertical direction while the word line WLA for an A port and the word line WLB for a B port are aligned in the horizontal direction. The bit line BLAc for an A port and the bit line BLBc for a B port are positioned adjacent to each other, and the bit line BLAt for an A port and the bit line BLBt for a B port are positioned adjacent to each other.

The diffusion layer D21 is connected to the wiring H21 via a contact C21, the diffusion layer D22 is connected to the wiring H22 via a contact C23, the diffusion layer D23 is connected to the wiring H23 via a contact C24, the diffusion layer D24 is connected to the wiring H24 via contacts C25 and C26, the diffusion layer D25 is connected to the wiring H26 via contacts C27, the diffusion layer D26 is connected to the wiring H27 via a contact C29, the diffusion layer D27 is connected to the wiring H28 via a contact C30, and the diffusion layer D28 is connected to the wiring H29 via contacts C31 and C32. The gate electrode G21 is connected to the wiring H30 via a contact C44, the gate electrode G22 is connected to the wiring H34 via a contact C22, the gate electrode G24 is connected to the wiring H25 via a contact C43, and the gate electrode G25 is connected to the wiring H31 via a contact C28.

The diffusion layer D21' is connected to the diffusion layer D28' via a contact C33, a wiring H33, and contacts C41 and C42, and at the same time, it is connected to the diffusion layer D22' via the contact C33, the wiring H33, and a contact C34, and also to the diffusion layer D27' via the contact C33, the wiring H33, and a contact C35. The diffusion layer D25' is connected to the diffusion layer D24' via a contact C38, a wiring H32, and contacts C36 and C37, and at the same time, it is connected to the diffusion layer D26' via the contact C38, the wiring H32, and a contact C39, and also to the diffusion layer D23' via the contact C38, the wiring H32, and a contact C40. The gate electrode G23 is connected to the wiring H33 via the contact C35, and the gate electrode G26 is connected to the wiring H32 via the contact C40.

The contacts C21 to C44 can use embedded contacts in which conductors are embedded in the contacts C21 to C44. The embedded contacts can be collectively formed together with the wirings H21 to H34 by a dual damascene method or the like.

The bit line BLAc for an A port is connected to the diffusion layer D25 while the bit line BLAt for the A port is connected to the diffusion layer D21. The bit line BLBc for a B port is connected to the diffusion layer D26 while the bit line BLBt for the B port is connected to the diffusion layer D22. The word line WLA for the A port is connected to the gate electrodes G21 and G24 while the word line WLB for the B port is connected to the gate electrodes G22 and G25.

By isolating the diffusion layers D21 and D21' to diffusion layers D28 and D28' on the semiconductor substrate S2 to one another, and connecting the diffusion layers D21', D22', and D28' with the wiring H33, and at the same time, connecting the diffusion layers D24' and D25', and D26' with the wiring H32, the shape of an active region of the transmission transistors TFA1 and TFA2 for an A port can be matched and an STI stress dependability can be increased, and at the same time, the shape of an active region of the transmission transistors TFB1 and TFB2 for a B port can be matched and the STI stress dependability can be increased. Thus, a variation in the STI stress dependability between the transmission transistors for the same port can be decreased, and a threshold value voltage Vth according to the STI stress dependability can be raised, and as a result, the disturb feature of the bit cell can be improved.

In the second embodiment, the dual port SRAM is used as an example. However, the second embodiment can be also applied to a single-port SRAM. When applying to the single-port SRAM, the transmission transistors TFA1 and TFA2 for an A port, the bit lines BLAc and BLAt for an A port, and the word line WLA for an A port in FIG. 3 can be deleted from the layout in FIG. 4.

Figure 5:
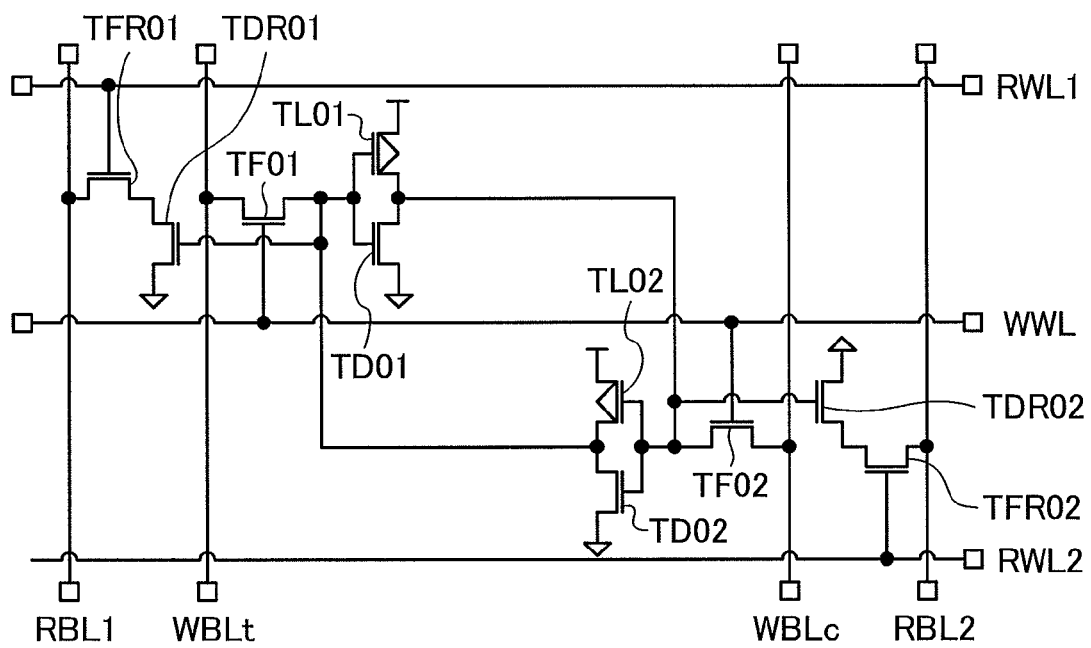
FIG. 5 depicts a circuit configuration of a bit cell of a semiconductor memory device according to a third embodiment of the present invention.

FIG. 5 depicts a circuit configuration of a bit cell of a semiconductor memory device according to a third embodiment of the present invention.

In FIG. 5, a pair of driving transistors TD01 and TD02, a pair of load transistors TL01 and TL02, a pair of transmission transistors TF01 and TF02, a pair of read-only transmission transistors TFR01 and TFR02, and a pair of read-only driving transistors TDR01 and TDR02 are arranged in the bit cell of an SRAM used as a semiconductor memory device. P-channel field effect transistors can be used as the load transistors TL01 and TL02 while N-channel field effect transistors can be used as the driving transistors TD01 and TD02, the transmission transistors TF01 and TF02, the read-only transmission transistors TFR01 and TFR02, and the read-only driving transistors TDR01 and TDR02.

In the bit cell, a word line WWL for writing, a first word line RWL1 for reading, a second word line RWL2 for reading, a pair of bit lines WBLt and WBLc for writing, a first bit line RBL1 for reading, and a second bit line RBL2 for reading are arranged.

One CMOS inverter is configured by connecting the driving transistor TD01 and the load transistor TL01 to each other in a series while the other CMOS inverter is configured by connecting the driving transistor TD02 and the load transistor TL02 to each other in a series. A flip-flop is configured by cross-coupling output and input of the pair of CMOS inverters to each other.

A gate of the driving transistor TD01, a gate of the load transistor TL01, a drain of the driving transistor TD02, and a drain of the load transistor TL02 are connected to a drain of the transmission transistor TF01.

A drain of the driving transistor TD01, a drain of the load transistor TL01, a gate of the driving transistor TD02, and a gate of the load transistor TL02 are connected to a drain of the transmission transistor TF02.

A gate of the driving transistor TD01, a gate of the load transistor TL01, a drain of the driving transistor TD02, and a drain of the load transistor TL02 are connected to a gate of the read-only driving transistor TDR01.

A drain of the driving transistor TD01, a drain of the load transistor TL01, a gate of the driving transistor TD02, and a gate of the load transistor TL02 are connected to a gate of the read-only driving transistor TDR02.

A drain of the read-only driving transistor TDR01 is connected to a drain of the read-only transmission transistor TFR01 while a drain of the read-only driving transistor TDR02 is connected to a drain of the read-only transmission transistor TFR02.

The gates of the transmission transistors TF01 and TF02 are connected to the word line WWL for writing. The gate of the read-only transmission transistor TFR01 is connected to the first word line RWL1 for reading. The gate of the read-only transmission transistor TFR02 is connected to the second word line RWL2 for reading.

A source of each of the transmission transistors TF01 and TF02 is connected to the bit line WBLt and WBLc for writing. A source of the read-only transmission transistor TFR01 is connected to the first bit line RBL1 for reading. A source of the read-only transmission transistor TFR02 is connected to the second bit line RBL2 for reading.

When accessing the bit cell from a write port, the bit cell can be selected and data can be written in the bit cell from the write port by operating the transmission transistors TF01 and TF02 via the word line WWL for writing and the bit lines WBLt and WBLc for writing.

When accessing the bit cell from a first read port, the bit cell can be selected and data can be read into the first read port from the bit cell by operating the read-only transmission transistor TFR01 via the first word line RWL1 for reading and the first bit line RBL1 for reading.

When accessing the bit cell from a second read port, the bit cell can be selected and data can be read into the second read port from the bit cell by operating the read-only transmission transistor TFR02 via the second word line RWL2 for reading and the second bit line RBL2 for reading.

Accordingly, by arranging ten transistors in the bit cell, the SRAM can be imparted with one write port and two read ports, and is enabled to simultaneously write one set of data and read the data with two read ports.

By arranging the read-only driving transistor TDR01, interference between a potential of the first bit line RBL1 for reading and that of the bit line WBLt for writing can be prevented even when the transmission transistor TF01 and the read-only transmission transistor TFR01 are turned on simultaneously. By arranging the read-only driving transistor TDR02, interference between a potential of the second bit line RBL2 for reading and that of the bit line WBLc for writing can be prevented even when the transmission transistor TF02 and the read-only transmission transistor TFR02 are turned on simultaneously.

Figure 6:
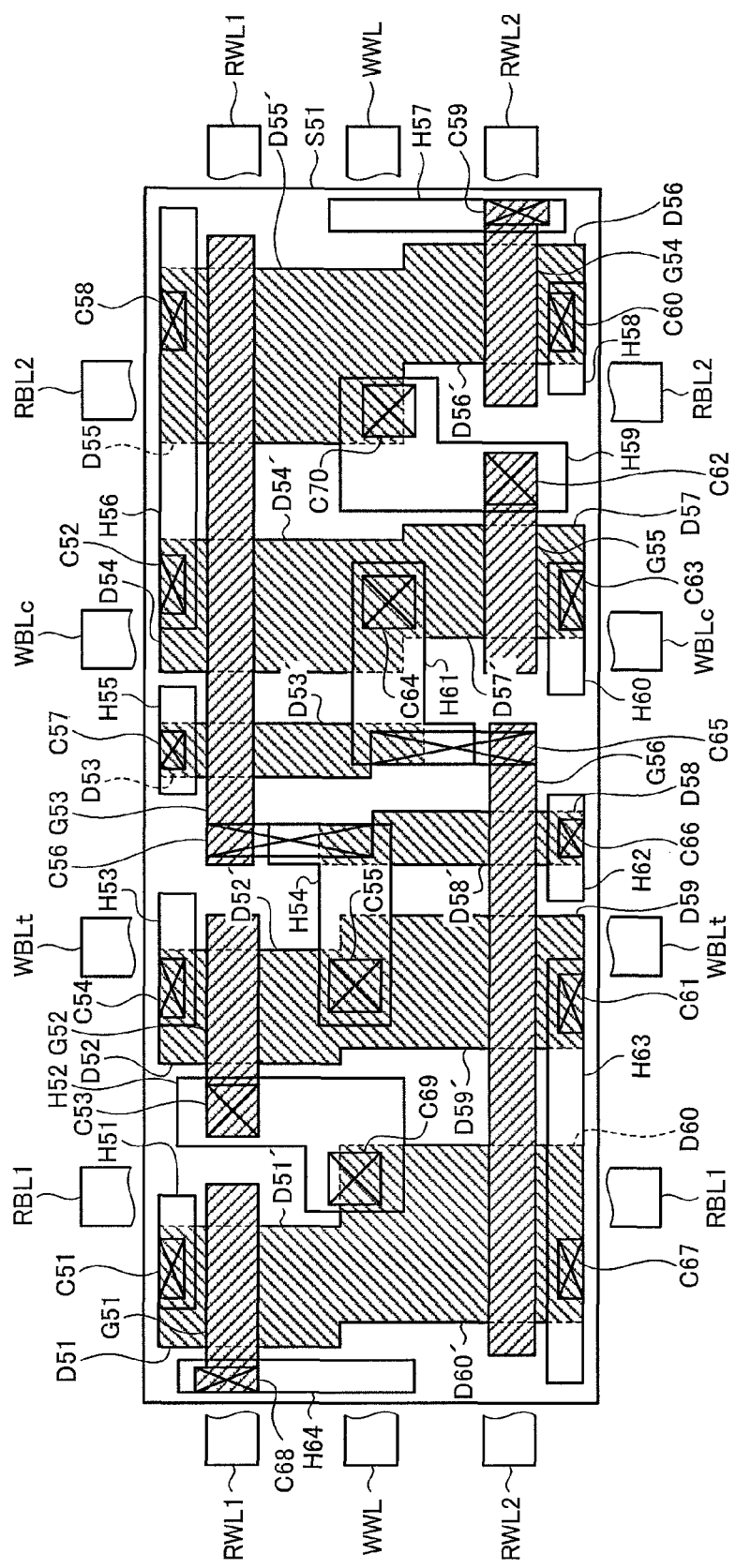
FIG. 6 is a plan view of a layout configuration of a bit cell of the semiconductor memory device according to the third embodiment.

FIG. 6 is a plan view of a layout configuration of a bit cell of the semiconductor memory device according to the third embodiment.

In FIG. 6, on a semiconductor substrate S51, gate electrodes G51 to G56 are positioned. The gate electrodes G51 to G53 are aligned in the horizontal direction, and at the same time, the gate electrodes G54 to G56 are also aligned in the horizontal direction. The gate electrodes G51 to G53 and the gate electrodes G54 to G56 are aligned in the vertical direction so that the both gate electrodes form rotational symmetry to each other.

The read-only transmission transistor TFR01 in FIG. 5 is configured by forming diffusion layers D51 and D51' on the semiconductor substrate S51 such that each diffusion layer is positioned on either side of the gate electrode G51. The transmission transistor TF01 in FIG. 5 is configured by forming diffusion layers D52 and D52' on the semiconductor substrate S51 such that each diffusion layer is positioned on either side of the gate electrode G52.

The load transistor TL01 in FIG. 5 is configured by forming diffusion layers D58 and D58' on the semiconductor substrate S51 such that each diffusion layer is positioned on either side of the gate electrode G56. The driving transistor TD01 in FIG. 5 is configured by forming diffusion layers D59 and D59' on the semiconductor substrate S51 such that each diffusion layer is positioned on either side of the gate electrode G56. The read-only driving transistor TDR01 in FIG. 5 is configured by forming diffusion layers D60 and D60' on the semiconductor substrate S51 such that each diffusion layer is positioned on either side of the gate electrode G56.

The read-only transmission transistor TFR02 in FIG. 5 is configured by forming diffusion layers D56 and D56' on the semiconductor substrate S51 such that each diffusion layer is positioned on either side of the gate electrode G54. The transmission transistor TF02 in FIG. 5 is configured by forming diffusion layers D57 and D57' on the semiconductor substrate S51 such that each diffusion layer is positioned on either side of the gate electrode G55.

The load transistor TL02 in FIG. 5 is configured by forming diffusion layers D53 and D53' on the semiconductor substrate S51 such that each diffusion layer is positioned on either side of the gate electrode G53. The driving transistor TD02 in FIG. 5 is configured by forming diffusion layers D54 and D54' on the semiconductor substrate S51 such that each diffusion layer is positioned on either side of the gate electrode G53. The read-only driving transistor TDR02 in FIG. 5 is configured by forming diffusion layers D55 and D55' on the semiconductor substrate S51 such that each diffusion layer is positioned on either side of the gate electrode G53.

The diffusion layers D51' and D60' are connected with each other, the diffusion layers D52' and D59' are connected with each other, the diffusion layers D54' and D57' are connected with each other, and the diffusion layers D55' and D56' are connected with each other. The diffusion layers D51, D51', D60, and D60'; the diffusion layers D52, D52', D59, and D59'; the diffusion layers D53 and D53'; the diffusion layers D58 and D58'; the diffusion layers D54, D54', D57, and D57'; and the diffusion layers D55, D55', D56, and D56' are isolated from one another on the semiconductor substrate S51 via an element isolation region. For the element isolation region, either an STI structure or a LOCOS structure can be used, for example.

The diffusion layers D51, D51', D60, and D60'; the diffusion layers D52, D52', D59, and D59', and the diffusion layers D53 and D53'; the diffusion layers D58 and D58'; the diffusion layers D54, D54', D57, and D57'; and the diffusion layers D55, D55', D56, and D56' are aligned in the horizontal direction. The gate electrode G53 is shard among the diffusion layers D53, D53', D54, D54', D55, and D55' while the gate electrode G56 is shared among the diffusion layers D58, D58', D59, D59', D60, and D60'.

Wirings H51 to H64 are formed on the gate electrodes G51 to G56; the bit lines WBLt and WBLc for writing, the first bit line RBL1 for reading, and the second bit line RBL2 for reading are formed on the wirings H51 to H64; and the word line WWL for writing, the first word line RWL1 for reading, and the second word line RWL2 for reading are formed on the bit lines WBLt and WBLc for writing, the first bit line RBL1 for reading, and the second bit line RBL2 for reading. The wirings H51 to H64 can be used as the first wiring layer, the bit lines WBLt and WBLc for writing, and the first bit line RBL1 for reading and the second bit line RBL2 for reading can be used as the second wiring layer, and the word line WWL for writing, the first word line RWL1 for reading, and the second word line RWL2 for reading can be used as the third wiring layer.

The bit lines WBLt and WBLc for writing, and the first bit line RBL1 for reading and the second bit line RBL2 for reading can be aligned in the vertical direction, the word line WWL for writing, and the first word line RWL1 for reading and the second word line RWL2 for reading can be aligned in the horizontal direction. The first word line RWL1 for reading is positioned on the gate electrodes G51 to G53, the second word line RWL2 for reading is positioned on the gate electrodes G54 to G56, and a word line WWL for writing is positioned between the first word line RWL1 for reading and the second word line RWL2 for reading.

The diffusion layer D51 is connected to the wiring H1 via a contact C51, the diffusion layer D52 is connected to the wiring H53 via a contact C54, the diffusion layer D53 is connected to the wiring H55 via a contact C57, the diffusion layer D54 is connected to the wiring H56 via a contact C52, the diffusion layer D55 is connected to the wiring H56 via a contact C58, the diffusion layer D56 is connected to the wiring H58 via a contact C60, the diffusion layer D57 is connected to the wiring H60 via a contact C63, the diffusion layer D58 is connected to the wiring H62 via a contact C66, the diffusion layer D59 is connected to the wiring H63 via a contact C61, and the diffusion layer D60 is connected to the wiring H63 via a contact C67.

The diffusion layers D52' and D59' are connected to the wiring H54 via a contact C55, the diffusion layer D58' is connected to the wiring H54 via a contact C56, the diffusion layer D53' is connected to the wiring H61 via a contact C65, and the diffusion layers D54' and D57' are connected to the wiring H61 via a contact C64.

The gate electrode G51 is connected to the wiring H64 via a contact C68, the gate electrode G52 is connected to the wiring H52 via a contact C53, the gate electrode G53 is connected to the wiring H54 via the contact C56, the gate electrode G54 is connected to the wiring H57 via a contact C59, the gate electrode G55 is connected to the wiring H60 via a contact C63, and the gate electrode G56 is connected to the wiring H61 via a contact C65.

The contacts C51 to C68 can use embedded contacts in which conductors are embedded in the contacts C51 to C68. These embedded contacts can be collectively formed together with the wirings H51 to H64 by a dual damascene method or the like.

The bit line WBLt for writing is connected to the diffusion layer D52, the bit line WBLc for writing is connected to the diffusion layer D57, the first bit line RBL1 for reading is connected to the diffusion layer D51, and the second bit line RBL2 for reading is connected to the diffusion layer D56. The word line WWL for writing is connected respectively to the wiring H52 and H59 via contacts C69 and C70, respectively, and the first word line RWL1 for reading is connected to the gate electrode G51 while the second word line RWL2 for reading is connected to the gate electrode G54.

By arranging the word line WWL for writing between the first word line RWL1 for reading and the second word line RWL2 for reading, it becomes possible to simultaneously write one set of data and read two sets of data, and even when ten transistors are arranged in the bit cell, the SRAM can be imparted with one write port and two read ports.

The third embodiment shown in FIG. 6 describes a method of isolating the diffusion layers D58 and D58' of the load transistor TL01 of FIG. 5 and the diffusion layers D59 and D59' of the driving transistor TD01 of FIG. 5, and at the same time, isolating the diffusion layers D53 and D53' of the load transistor TL02 of FIG. 5 and the diffusion layers D54 and D54' of the driving transistor TD02 of FIG. 5, and connecting the diffusion layers D58' and D59' via the wiring H54, and at the same time, connecting the diffusion layers D53' and D54' via the wiring H61. However, the diffusion layers D58' and D59' can be connected directly, and the diffusion layers D53' and D54' can also be connected directly.

Figure 7:
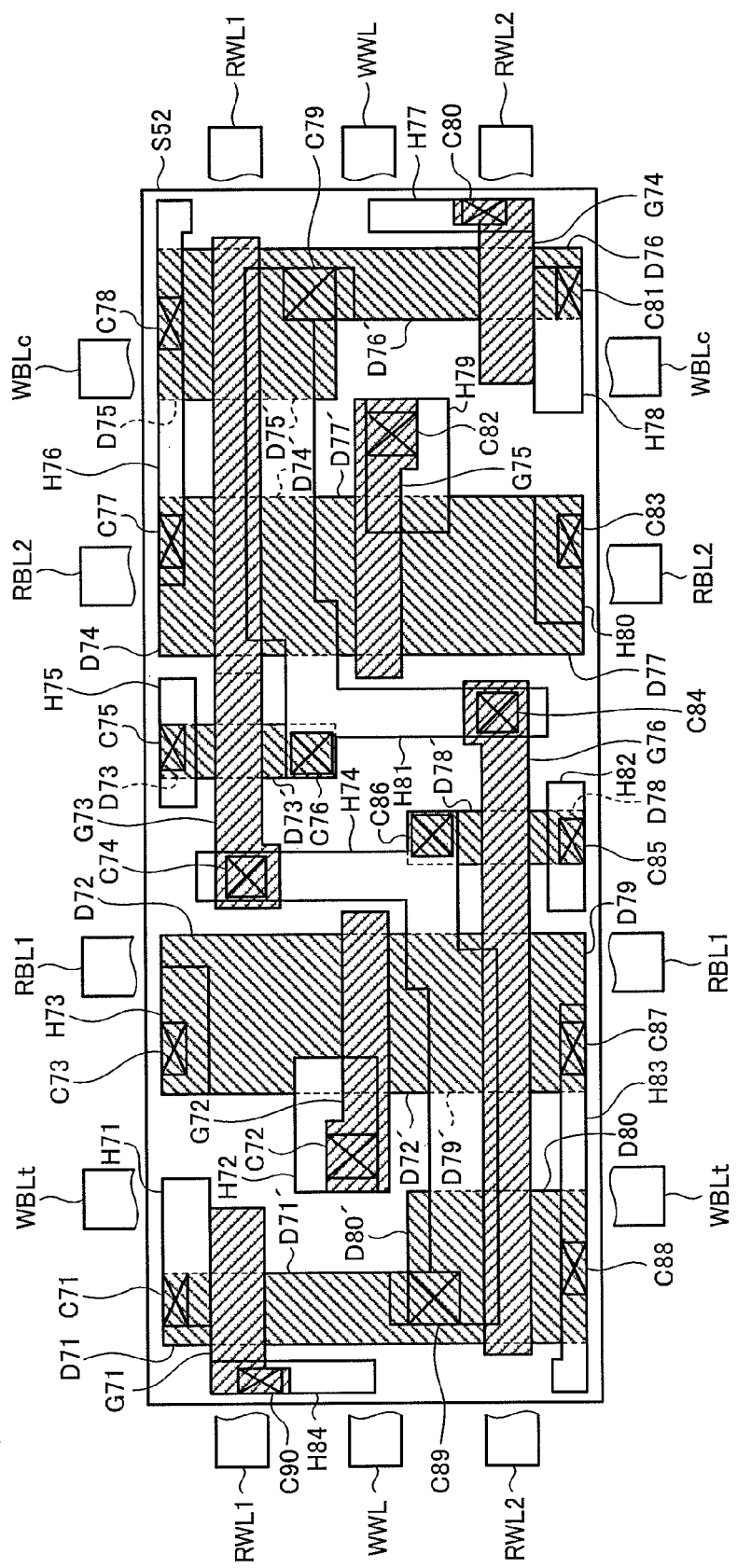
FIG. 7 is a plan view of a layout configuration of a bit cell of a semiconductor memory device according to a fourth embodiment of the present invention.

FIG. 7 is a plan view of a layout configuration of a bit cell of a semiconductor memory device according to a fourth embodiment of the present invention.

In FIG. 7, on a semiconductor substrate S52, gate electrodes G71 to G76 are positioned. The gate electrodes G71 and G73 are positioned on the same straight line, the gate electrodes G72 and G75 are positioned on a straight line different from that on which the gate electrodes G71 and G73 are positioned, and the gate electrodes G74 and G76 are positioned on a straight line that is different from those on which the gate electrodes G71 and G73 and the gate electrodes G72 and G75 are positioned, respectively. The gate electrodes G71 to G73 and the gate electrodes G74 to G76 are aligned in the vertical direction so that the both gate electrodes form rotational symmetry to each other.

The transmission transistor TF01 in FIG. 5 is configured by forming diffusion layers D71 and D71' on the semiconductor substrate S52 such that each diffusion layer is positioned on either side of the gate electrode G71. The read-only transmission transistor TFR01 in FIG. 5 is configured by forming diffusion layers D72 and D72' on the semiconductor substrate S52 such that each diffusion layer is positioned on either side of the gate electrode G72.

The load transistor TL01 in FIG. 5 is configured by forming diffusion layers D78 and D78' on the semiconductor substrate S52 such that each diffusion layer is positioned on either side of the gate electrode G76. The read-only driving transistor TDR01 in FIG. 5 is configured by forming diffusion layers D79 and D79' on the semiconductor substrate S52 such that each diffusion layer is positioned on either side of the gate electrode G76. The driving transistor TD01 in FIG. 5 is configured by forming diffusion layers D80 and D80' on the semiconductor substrate S52 such that each diffusion layer is positioned on either side of the gate electrode G76.

The transmission transistor TF02 in FIG. 5 is configured by forming diffusion layers D76 and D76' on the semiconductor substrate S52 such that each diffusion layer is positioned on either side of the gate electrode G74. The read-only transmission transistor TFR02 in FIG. 5 is configured by forming diffusion layers D77 and D77' on the semiconductor substrate S52 such that each diffusion layer is positioned on either side of the gate electrode G75.

The load transistor TL02 in FIG. 5 is configured by forming diffusion layers D73 and D73' on the semiconductor substrate S52 such that each diffusion layer is positioned on either side of the gate electrode G73. The read-only driving transistor TDR02 in FIG. 5 is configured by forming diffusion layers D74 and D74' on the semiconductor substrate S52 such that each diffusion layer is positioned on either side of the gate electrode G73. The driving transistor TD02 in FIG. 5 is configured by forming diffusion layers D75 and D75' on the semiconductor substrate S52 such that each diffusion layer is positioned on either side of the gate electrode G73.

The diffusion layers D71' and D80' are connected with each other, the diffusion layers D72' and D79' are connected with each other, the diffusion layers D74' and D77' are connected with each other, and the diffusion layers D75' and D76' are connected with each other. The diffusion layers D71, D71', D80, and D80'; the diffusion layers D72, D72', D79, and D79'; the diffusion layers D73 and D73'; the diffusion layers D78 and D78'; the diffusion layers D74, D74', D77, and D77'; the diffusion layers D75, D75', D76, and D76' are isolated from one another on the semiconductor substrate S52 via an element isolation region. For the element isolation region, either an STI structure or a LOCOS structure can be used, for example.

The diffusion layers D71, D71', D80, and D80'; the diffusion layers D72, D72', D79, and D79'; the diffusion layers D73 and D73'; the diffusion layers D78 and D78'; the diffusion layers D74, D74', D77, and D77'; and the diffusion layers D75, D75', D76, and D76' are aligned in the horizontal direction. The gate electrode G73 is shard among the diffusion layers D73, D73', D74, D74', D75, and D75' while the gate electrode G76 is shared among the diffusion layers D78, D78', D79, D79', D80, and D80'.

The gate electrodes G71 to G76 is formed thereon with wirings H71 to H84, the wirings H71 to H84 are formed thereon with the bit lines WBLt and WBLc for writing, and the first bit line RBL1 for reading and the second bit line RBL2 for reading, and the bit lines WBLt and WBLc for writing, and the first bit line RBL1 for reading and the second bit line RBL2 for reading are formed thereon with the word line WWL for writing, and the first word line RWL1 for reading and the second word line RWL2 for reading. The wirings H71 to H84 can be used as the first wiring layer, the bit lines WBLt and WBLc for writing, and the first bit line RBL1 for reading and the second bit line RBL2 for reading can be used as the second wiring layer, and the word line WWL for writing, the first word line RWL1 for reading, and the second word line RWL2 for reading can be used as the third wiring layer.

The bit lines WBLt and WBLc for writing, and the first bit line RBL1 for reading and the second bit line RBL2 for reading can be aligned in the vertical direction, the word line WWL for writing, and the first word line RWL1 for reading and the second word line RWL2 for reading can be aligned in the horizontal direction. The first word line RWL1 for reading is positioned on the gate electrodes G71 and G73, the second word line RWL2 for reading is positioned on the gate electrodes G74 and G76, and the word line WWL for writing is positioned on the gate electrodes G72 and G75.

The diffusion layer D71 is connected to the wiring H71 via a contact C71, the diffusion layer D72 is connected to the wiring H73 via a contact C73, the diffusion layer D73 is connected to the wiring H75 via a contact C75, the diffusion layer D74 is connected to the wiring H76 via a contact C77, the diffusion layer D75 is connected to the wiring H76 via a contact C78, the diffusion layer D76 is connected to the wiring H78 via a contact C81, the diffusion layer D77 is connected to the wiring H80 via a contact C83, the diffusion layer D78 is connected to the wiring H82 via a contact C85, the diffusion layer D79 is connected to the wiring H83 via a contact C87, and the diffusion layer D80 is connected to the wiring H83 via a contact C88.

The diffusion layers D71' and D80' are connected to the wiring H74 via a contact C89, the diffusion layer D78' is connected to the wiring H74 via a contact C86, the diffusion layer D73' is connected to the wiring H81 via a contact C76, and the diffusion layers D75' and D76' are connected to the wiring H81 via a contact C79.

The gate electrode G71 is connected to the wiring H84 via a contact C90, the gate electrode G72 is connected to the wiring H72 via a contact C72, the gate electrode G73 is connected to the wiring H74 via a contact C74, the gate electrode G74 is connected to the wiring H77 via a contact C80, the gate electrode G75 is connected to the wiring H79 via a contact C82, and the gate electrode G76 is connected to the wiring H81 via a contact C84.

The contacts C71 to C90 can use embedded contacts in which conductors are embedded within the contacts C71 to C90. These embedded contacts can be collectively formed together with the wirings H71 to H84 by a dual damascene method or the like.

The bit line WBLt for writing is connected to the diffusion layer D71, the bit line WBLc for writing is connected to the diffusion layer D76, the first bit line RBL1 for reading is connected to the diffusion layer D72, and the second bit line RBL2 for reading is connected to the diffusion layer D77. The word line WWL for writing is connected to the gate electrodes G71 and G74, the first word line RWL1 for reading is connected to the gate electrode G72, and the second word line RWL2 for reading is connected to the gate electrode G75.

By positioning the word line WWL for writing between the first word line RWL1 for reading and the second word line RWL2 for reading, it becomes possible to simultaneously write one set of data and read two sets of data, and the SRAM can be imparted with one write port and two read ports.

By positioning the gate electrodes G71 and G73 below the first word line RWL1 for reading, the gate electrodes G74 and G76 below the second word line RWL2 for reading, and the gate electrodes G72 and G75 below the word line WWL for writing, the interval between the gate electrodes G71 and G73 can be reduced, and at the same time, the interval between the gate electrodes G74 and G76 can also be reduced. Thus, the horizontal dimension of a unit can be reduced without having to increase the vertical dimension of the unit, and the integration of SRAM can be improved, and at the same time, the length of the word line WWL for writing, the first word line RWL1 for reading and the second word line RWL2 for reading can be shortened. As a result, the resistance of the word line WWL for writing, the first word line RWL1 for reading and the second word line RWL2 for reading can be reduced, and rising inclination of a potential of the word line WWL for writing, the first word line RWL1 for reading and the second word line RWL2 for reading can be made steeper, and thus the operation speed of SRAM can be improved.

The fourth embodiment shown in FIG. 7 describes a method by which the gate electrodes G71 and G73 are positioned on the same straight line, the gate electrodes G72 and G75 are positioned on a straight line different from that on which the gate electrodes G71 and G73 are positioned, and gate electrodes G74 and G76 are positioned on a straight line different from those on which gate electrodes G71 and G73 and G72 and G75 are positioned, respectively. However, there is no problem as long as the gate electrodes G71 and G72 are positioned on straight lines different from each other, and the gate electrodes G74 and G75 are positioned on straight lines different from each other. For example, the gate electrodes G71 and G74 can be positioned on the same straight line, the gate electrodes G72 and G73 can be positioned on a straight line different from that on which the gate electrodes G71 and G74 are positioned, and the gate electrodes G75 and G76 can be positioned on a straight line different from those on which the gate electrodes G71 and G74 and G72 and G73 are positioned, respectively.

The fourth embodiment shown in FIG. 7 describes a method of isolating the diffusion layers D78 and D78' of the load transistor TL01 of FIG. 5 and the diffusion layers D80 and D80' of the driving transistor TD01 of FIG. 5, and at the same time, isolating the diffusion layers D73 and D73' of the load transistor TL02 of FIG. 5 and the diffusion layers D75 and D75' of the driving transistor TD02 of FIG. 5, and positioning the diffusion layers D79 and D79' of the read-only driving transistor TDR01 between the diffusion layers D78 and D78' of the load transistor TL01 and the diffusion layers D80 and D80' of the driving transistor TD01, and at the same time, positioning the diffusion layers D74 and D74' of the read-only driving transistor TDR02 between the diffusion layers D73 and D73' of the load transistor TL02 and the diffusion layers D75 and D75' of the driving transistor TD02. However, the diffusion layers D78 and D78' of the load transistor TL01, and the diffusion layers D80 and D80' of the driving transistor TD01 can be positioned adjacent to each other, and at the same time, the diffusion layers D73 and D73' of the load transistor TL02, and the diffusion layers D75 and D75' of the driving transistor TD02 can be positioned adjacent to each other.

Figure 8:
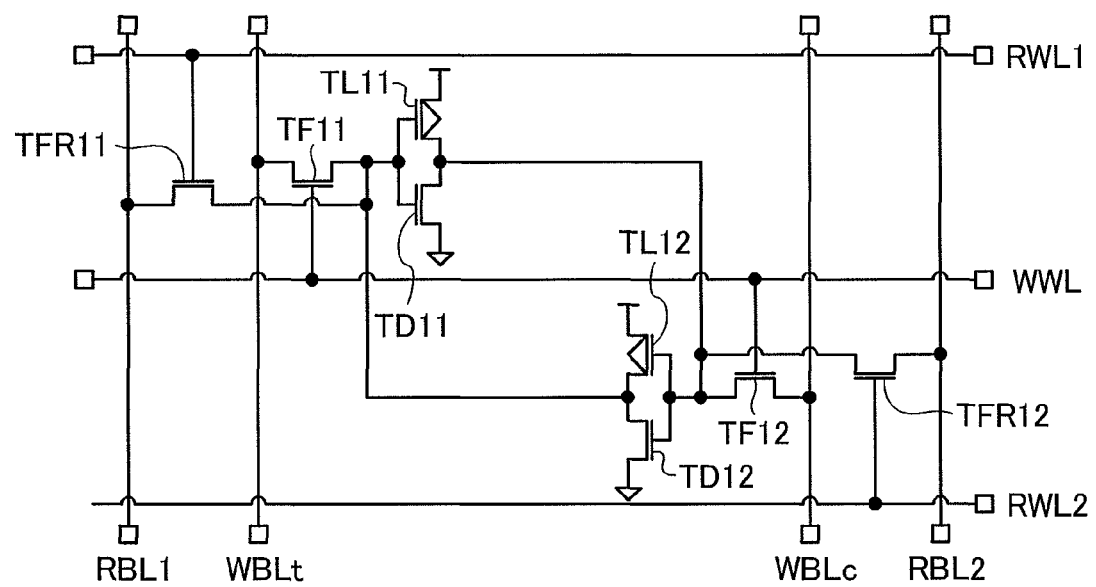
FIG. 8 depicts a circuit configuration of a bit cell of a semiconductor memory device according to a fifth embodiment of the present invention.

FIG. 8 depicts a circuit configuration of a bit cell of a semiconductor memory device according to a fifth embodiment of the present invention.

In FIG. 8, a pair of driving transistors TD11 and TD12, a pair of load transistors TL11 and TL12, a pair of transmission transistors TF11 and TF12, and a pair of read-only transmission transistors TFR11 and TFR12 are arranged in a bit cell of an SRAM used as a semiconductor memory device. P-channel field effect transistors can be used as the load transistors TL11 and TL12 while N-channel field effect transistors can be used as the driving transistors TD11 and TD12, the transmission transistors TF11 and TF12, and the read-only transmission transistors TFR11 and TFR12.

In the bit cell, a word line WWL for writing, the first word line RWL1 for reading, the second word line RWL2 for reading, a pair of bit lines WBLt and WBLc for writing, the first bit line RBL1 for reading, and the second bit line RBL2 for reading are arranged.

One CMOS inverter is configured by connecting the driving transistor TD11 and the load transistor TL11 to each other in a series while the other CMOS inverter is configured by connecting the driving transistor TD12 and the load transistor TL12 to each other in a series. A flip-flop is configured by cross-coupling output and input of the pair of CMOS inverters to each other.

A gate of the driving transistor TD11, a gate of the load transistor TL11, a drain of the driving transistor TD12, and a drain of the load transistor TL12 are connected to a drain of the transmission transistor TF11.

A drain of the driving transistor TD11, a drain of the load transistor TL11, a gate of the driving transistor TD12, and a gate of the load transistor TL12 are connected to a drain of the transmission transistor TF12.

A gate of the driving transistor TD11, a gate of the load transistor TL11, a drain of the driving transistor TD12, and a drain of the load transistor TL12 are connected to a drain of the read-only transmission transistor TFR11.

A drain of the driving transistor TD11, a drain of the load transistor TL11, a gate of the driving transistor TD12, and a gate of the load transistor TL12 are connected to a drain of the read-only transmission transistor TFR12.

Gates of the transmission transistors TF11 and TF12 are connected to the word line WWL for writing. A gate of the read-only transmission transistor TFR11 is connected to the first word line RWL1 for reading. A gate of the read-only transmission transistor TFR12 is connected to the second word line RWL2 for reading.

Sources of the transmission transistors TF11 and TF12 are respectively connected to the bit lines WBLt and WBLc for writing. A source of the read-only transmission transistor TFR11 is connected to the first bit line RBL1 for reading. A source of the read-only transmission transistor TFR12 is connected to the second bit line RBL2 for reading.

When accessing the bit cell from a write port, the bit cell can be selected and data can be written in the bit cell from the write port by operating the transmission transistors TF11 and TF12 via the word line WWL for writing and the bit lines WBLt and WBLc for writing.

When accessing the bit cell from a first read port, the bit cell can be selected and data can be read into the first read port from the bit cell by operating the read-only transmission transistor TFR11 via the first word line RWL1 for reading and the first bit line RBL1 for reading.

When accessing the bit cell from a second read port, the bit cell can be selected and data can be read into the second read port from the bit cell by operating the read-only transmission transistor TFR12 via the second word line RWL2 for reading and the second bit line RBL2 for reading.

Accordingly, by arranging eight transistors in the bit cell, the SRAM can be imparted with one write port and two read ports, and it becomes possible to simultaneously write one set of data and read the data with two read ports.

Figure 9:
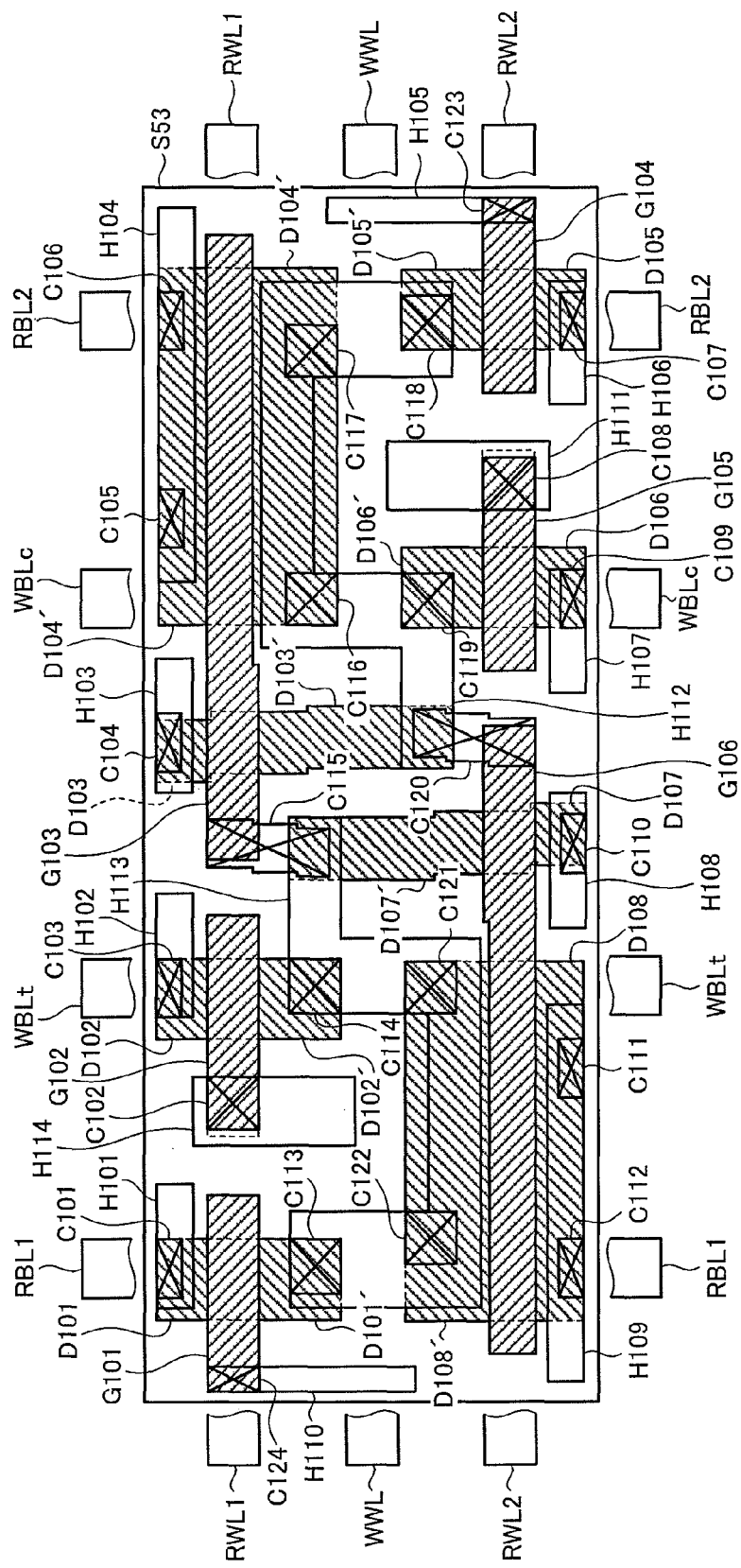
FIG. 9 is a plan view of a layout configuration of a bit cell of the semiconductor memory device according to the fifth embodiment.

FIG. 9 is a plan view of a layout configuration of a bit cell of the semiconductor memory device according to the fifth embodiment.

In FIG. 9, on a semiconductor substrate S53, gate electrodes G101 to G106 are positioned. The gate electrodes G101 to G103 are aligned in the horizontal direction, and at the same time, the gate electrodes G104 to G106 are also aligned in the horizontal direction. The gate electrodes G101 to G103 and the gate electrodes G104 to G106 are aligned in the vertical direction so that the both gate electrodes form rotational symmetry to each other.

A read-only transmission transistor TFR011 in FIG. 8 is configured by forming diffusion layers D101 and D101' on the semiconductor substrate S53 such that each diffusion layer is positioned on either side of the gate electrode G101. A transmission transistor TF011 in FIG. 8 is configured by forming diffusion layers D102 and D102' on the semiconductor substrate S53 such that each diffusion layer is positioned on either side of the gate electrode G102.

A load transistor TL011 in FIG. 8 is configured by forming diffusion layers D103 and D103' on the semiconductor substrate S53 such that each diffusion layer is positioned on either side of the gate electrode G103. A driving transistor TD011 in FIG. 8 is configured by forming diffusion layers D104 and D104' on the semiconductor substrate S53 such that each diffusion layer is positioned on either side of the gate electrode G103.

A read-only transmission transistor TFR012 in FIG. 8 is configured by forming diffusion layers D105 and D105' on the semiconductor substrate S53 such that each diffusion layer is positioned on either side of the gate electrode G104. A transmission transistor TF012 in FIG. 8 is configured by forming diffusion layers D106 and D106' on the semiconductor substrate S53 such that each diffusion layer is positioned on either side of the gate electrode G105.

A load transistor TL012 in FIG. 8 is configured by forming diffusion layers D107 and D107' on the semiconductor substrate S53 such that each diffusion layer is positioned on either side of the gate electrode G106. A driving transistor TD012 in FIG. 8 is configured by forming diffusion layers D108 and D108' on the semiconductor substrate S53 such that each diffusion layer is positioned on either side of the gate electrode G106.

The diffusion layers D101 and D101', the diffusion layers D102 and D102', the diffusion layers D103 and D103', the diffusion layers D104 and D104', the diffusion layers D105, D105', D106, and D106', the diffusion layers D107 and D107', and the diffusion layers D108 and D108' are isolated from one another on the semiconductor substrate S53 via an element isolation region. For the element isolation region, either an STI structure or a LOCOS structure can be used, for example.

The diffusion layers D101 and D101', the diffusion layers D102 and D102', the diffusion layers D103 and D103', and the diffusion layers D104 and D104' are aligned in the horizontal direction. The diffusion layers D105, D105', D106, and D106', the diffusion layers D107 and D107', and the diffusion layers D108 and D108' are also aligned in the horizontal direction. The gate electrode G103 is shard among the diffusion layers D103, D103', D104, and D104' while the gate electrode G106 is shared among the diffusion layers D107, D107', D108, and D108'.

On the gate electrodes G101 to G106, wirings H101 to H114 are formed, on the wirings H101 to H114, the bit lines WBLt and WBLc for writing, and the first bit line RBL1 for reading and the second bit line RBL2 for reading are formed, and on the bit lines WBLt and WBLc for writing, and the first bit line RBL1 for reading and the second bit line RBL2 for reading, the word line WWL for writing, and the first word line RWL1 for reading and the second word line RWL2 for reading are formed. The wirings H101 to H114 can be used as the first wiring layer, the bit lines WBLt and WBLc for writing, and the first bit line RBL1 for reading and the second bit line RBL2 for reading can be used as the second wiring layer, and the word line WWL for writing, the first word line RWL1 for reading, and the second word line RWL2 for reading can be used as the third wiring layer.

The bit lines WBLt and WBLc for writing, and the first bit line RBL1 for reading and the second bit line RBL2 for reading are aligned in the vertical direction, the word line WWL for writing, the first word line RWL1 for reading, and the second word line RWL2 for reading are aligned in the horizontal direction. The first word line RWL1 for reading is positioned on the gate electrodes G101 to G103, the second word line RWL2 for reading is positioned on the gate electrodes G104 to G106, and the word line WWL for writing is positioned between the first word line RWL1 for reading and the second word line RWL2 for reading.

The diffusion layer D101 is connected to the wiring H101 via a contact C101, the diffusion layer D102 is connected to the wiring H102 via a contact C103, the diffusion layer D103 is connected to the wiring H103 via a contact C104, the diffusion layer D104 is connected to the wiring H104 via contacts C105 and C106, the diffusion layer D105 is connected to the wiring H106 via a contact C107, the diffusion layer D106 is connected to the wiring H107 via a contact C109, the diffusion layer D107 is connected to the wiring H108 via a contact C110, and the diffusion layer D108 is connected to the wiring H109 via contacts C111 and C112.

The diffusion layer D101' is connected to the wiring H113 via a contact C113, the diffusion layer D102' is connected to the wiring H113 via a contact C114, the diffusion layer D103' is connected to the wiring H112 via a contact C120, the diffusion layer D104' is connected to the wiring H112 via contacts C116 and C117, the diffusion layer D105' is connected to the wiring H112 via a contact C118, the diffusion layer D106' is connected to the wiring H112 via a contact C119, the diffusion layer D107' is connected to the wiring H113 via a contact C115, and the diffusion layer D108' is connected to the wiring H113 via contacts C121 and C122.

The gate electrode G101 is connected to the wiring H110 via a contact C124, the gate electrode G102 is connected to the wiring H114 via a contact C102, the gate electrode G103 is connected to the wiring H113 via a contact C115, the gate electrode G104 is connected to the wiring H105 via a contact C123, the gate electrode G105 is connected to the wiring H111 via a contact C108, and the gate electrode G106 is connected to the wiring H112 via a contact C120.

The contacts C101 to C124 can use embedded contacts in which conductors are embedded in the contacts C101 to C124. The embedded contacts can collectively be formed together with the wirings H101 to H114 by a dual damascene method or the like.

The bit line WBLt for writing is connected to the diffusion layer D102, the bit line WBLc for writing is connected to the diffusion layer D106, the first bit line RBL1 for reading is connected to the diffusion layer D101, and the second bit line RBL2 for reading is connected to the diffusion layer D105. The word line WWL for writing is connected to the gate electrodes G102 and G105, the first word line RWL1 for reading is connected to the gate electrode G101, and the second word line RWL2 for reading is connected to the gate electrode G104.

By positioning the word line WWL for writing between the first word line RWL1 for reading and the second word line RWL2 for reading, it becomes possible to simultaneously write one set of data and read two sets of data, and even when eight transistors are arranged in the bit cell, the SRAM can be imparted with one write port and two read ports.

The fifth embodiment shown in FIG. 9 describes a method by which the gate electrodes G101 to G103 are positioned on the same straight line, and the gate electrodes G104 to G106 are positioned on a straight line different from that on which the gate electrodes G101 to G103 are positioned. However, the gate electrodes G101 and G103 can be positioned on the same straight line, the gate electrodes G104 and G106 can be positioned on a straight line different from that on which the gate electrodes G101 and G103 are positioned, and the gate electrodes G102 and G105 can be positioned on a straight line different from those on which the gate electrodes G101 and G103 and the gate electrodes G104 and G106 are positioned, respectively, or the gate electrodes G102 and G103 can be positioned on the same straight line, the gate electrodes G105 and G106 can be positioned on the straight line different from that on which the gate electrodes G102 and G103 are positioned, and the gate electrodes G101 and G104 can be positioned on a straight line different from those on which the gate electrodes G102 and G103 and the gate electrodes G105 and G106 are positioned, respectively.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device, comprising:
a first driving transistor comprising a first diffusion layer configured to serve as a drain and a second diffusion layer configured to serve as a source of the first driving transistor;
a second driving transistor comprising a first diffusion layer configured to serve as a drain and a second diffusion layer configured to serve as a source of the second driving transistor;
a first load transistor comprising a first diffusion layer configured to serve as a drain and a second diffusion layer configured to serve as a source of the first load transistor;
a second load transistor comprising a first diffusion layer configured to serve as a drain and a second diffusion layer configured to serve as a source of the second load transistor;
a first transmission transistor comprising a first diffusion layer configured to serve as a drain and a second diffusion layer configured to serve as a source of the first transmission transistor;
a second transmission transistor comprising a first diffusion layer configured to serve as a drain and a second diffusion layer configured to serve as a source of the second transmission transistor, wherein the first and second diffusion layers of each of the first driving transistor, the second driving transistor, the first load transistor, the second load transistor, the first transmission transistor, and the second transmission transistor are isolated on the semiconductor substrate from the first and second diffusion layers of one another via an element isolation region, and wherein the first and second driving transistors, the first and second load transistors, and the first and second transmission transistors are in a bit cell;
a first wiring configured to connect the drain of the first driving transistor, the drain of the first load transistor, and the drain of the first transmission transistor; and
a second wiring configured to connect the drain of the second driving transistor, the drain of the second load transistor, and the drain of the second transmission transistor,
wherein the first wiring and the second wiring are not connected to a bit line.

2. The semiconductor memory device of claim 1, further comprising:
a first gate electrode shared by the first driving transistor and the first load transistor;
a second gate electrode shared by the second driving transistor and the second load transistor;
a first lead electrode configured to connect the first gate electrode and the drain of the second load transistor, the first lead electrode directly extending from the first gate electrode, the first lead electrode being between the first diffusion layer of the first driving transistor and the first diffusion layer of the first load transistor in a plane where the first diffusion layer of the first driving transistor and the first diffusion layer of the first load transistor are arranged;
a second lead electrode configured to connect the second gate electrode and the drain of the first load transistor, the second lead electrode directly extending from the second gate electrode, the second lead electrode being between the first diffusion layer of the second driving transistor and the first diffusion layer of the second load transistor in a plane where the first diffusion layer of the second driving transistor and the first diffusion layer of the second load transistor are arranged.

3. The semiconductor memory device of claim 2, wherein
the first transmission transistor comprises a first A port transmission transistor and a second A port transmission transistor,
the second transmission transistor comprises a first B port transmission transistor and a second B port transmission transistor,
the first A port transmission transistor and the first B port transmission transistor are positioned adjacent to each other, and the second A port transmission transistor and the second B port transmission transistor are positioned adjacent to each other,
the drain of the first driving transistor, the drain of the first load transistor, a drain of the first A port transmission transistor, and a drain of the second A port transmission transistor are connected to one another by the first wiring, and
the drain of the second driving transistor, the drain of the second load transistor, a drain of the first B port transmission transistor, and a drain of the second B port transmission transistor are connected to one another by the second wiring.

4. The semiconductor memory device of claim 3, wherein
the first gate electrode, a gate electrode of the first A port transmission transistor, and a gate electrode of the first B port transmission transistor are aligned in a longitudinal direction along a first straight line, and
the second gate electrode, a gate electrode of the second A port transmission transistor, and a gate electrode of the second B port transmission transistor are aligned in a longitudinal direction along a second straight line parallel to the first straight line.

5. The semiconductor memory device of claim 1, wherein
the first transmission transistor comprises a first A port transmission transistor and a first B port transmission transistor,
the second transmission transistor comprises a second A port transmission transistor and a second B port transmission transistor,
the first A port transmission transistor and the second A port transmission transistor are positioned adjacent to each other, and the first B port transmission transistor and the second B port transmission transistor are positioned adjacent to each other,
the drain of the first driving transistor, the drain of the first load transistor, a drain of the first A port transmission transistor, and a drain of the first B port transmission transistor are connected to one another by the first wiring, and
the drain of the second driving transistor, the drain of the second load transistor, a drain of the second A port transmission transistor, and a drain of the second B port transmission transistor are connected to one another by the second wiring.

6. The semiconductor memory device of claim 5, further comprising:
a third gate electrode shared by the first A port transmission transistor and the second A port transmission transistor; and a fourth gate electrode shared by the first B port transmission transistor and the second B port transmission transistor.

7. The semiconductor memory device of claim 6, wherein the first gate electrode and the third gate electrode are aligned in a longitudinal direction along a first straight line, and the second gate electrode and the fourth gate electrode are aligned in a longitudinal direction along a second straight line parallel to the first straight line.

8. The semiconductor memory device of claim 7, further comprising:
a first A port bit line connected to a source of the first A port transmission transistor;
a second A port bit line connected to a source of the second A port transmission transistor, the second A port bit line being positioned adjacent to the first A port bit line;
a first B port bit line connected to a source of the first B port transmission transistor; and
a second B port bit line connected to a source of the second A port transmission transistor, the second B port bit line being positioned adjacent to the first B port bit line.

9. The semiconductor memory device of claim 8, further comprising:
a first wiring layer;
a second wiring layer;
an A port word line positioned in the second wiring layer;
a B port word line positioned in the second wiring layer, wherein
the A port word line and the B port word line are orthogonal to the first A port bit line the second A port bit line, the first B port bit line, and the second B port bit line, and
the first A port bit line, the second A port bit line, the first B port bit line, and the second B port bit line are positioned in the first wiring layer, being parallel to one another.

10. The semiconductor memory device of claim 9, further comprising:
a first power-supply potential line positioned in the first wiring layer, being parallel to the first A port bit line, the second A port bit line, the first B port bit line, and the second B port bit line; and
a second power-supply potential line positioned on the second wiring layer, being parallel to the A port word line and the B port word line.

11. The semiconductor memory device of claim 1, wherein the element isolation region comprises a shallow trench isolation (STI) structure or a local oxidation of silicon (LOCOS) structure.

12. A semiconductor memory device, comprising:
a first driving transistor;
a second driving transistor;
a first load transistor connected in series with the first driving transistor;
a second load transistor connected in series with the second driving transistor;
a first transmission transistor comprising a drain connected to a gate of the first driving transistor, a gate of the first load transistor, a drain of the second driving transistor, and a drain of the second load transistor;
a second transmission transistor comprising a drain connected to a drain of the first driving transistor, a drain of the first load transistor, a gate of the second driving transistor, and a gate of the second load transistor;
a first read-only driving transistor comprising a gate connected to the gate of the first driving transistor, the gate of the first load transistor, the drain of the second driving transistor, and the drain of the second load transistor;
a second read-only driving transistor comprising a gate connected to the drain of the first driving transistor, the drain of the first load transistor, the gate of the second driving transistor, and the gate of the second load transistor;
a first read-only transmission transistor comprising a drain connected to the drain of the first read-only driving transistor;
a second read-only transmission transistor comprising a drain connected to the drain of the second read-only driving transistor;
a writing word line connected to the gate of the first transmission transistor and the gate of the second transmission transistor;
a first reading word line connected to the gate of the first read-only transmission transistor;
a second reading word line connected to the gate of the second read-only transmission transistor;
a first writing bit line connected to a source of the first transmission transistor;
a second writing bit line connected to a source of the second transmission transistor;
a first reading bit line connected to a source of the first read-only transmission transistor; and
a second reading bit line connected to a source of the second read-only transmission transistor,
wherein the first reading word line is independent of the second reading word line.

13. The semiconductor memory device of claim 12, further comprising:
a first gate electrode shared in an integrated manner by the gate of the first driving transistor, the gate of the first load transistor, and the gate of the first read-only driving transistor; and
a second gate electrode shared in an integrated manner by the gate of the second driving transistor, the gate of the second load transistor, and the gate of the second read-only driving transistor.

14. The semiconductor memory device of claim 13, wherein
the first driving transistor comprises a diffusion layer configured to serve as the drain of the first driving transistor,
the first load transistor comprises a diffusion layer configured to serve as the drain of the first load transistor, the diffusion layer of the first load transistor being isolated from the diffusion layer of the first driving transistor,
the second driving transistor comprises a diffusion layer configured to serve as the drain of the second driving transistor,
the second load transistor comprises a diffusion layer configured to serve as the drain of the second load transistor, the diffusion layer of the second load transistor being isolated from the diffusion layer of the second driving transistor,
the first read-only driving transistor is configured to share a diffusion layer with the first read-only transmission transistor, the diffusion layer being configured to serve as the drains of the first read-only driving transistor and the first read-only transmission transistor,
the second read-only driving transistor is configured to share a diffusion layer with the second read-only transmission transistor, the diffusion layer being configured to serve as the drains of the second read-only driving transistor and the second read-only transmission transistor, the first driving transistor is configured to share a diffusion layer with the second transmission transistor, the diffusion layer being configured to server as the drains of the first driving transistor and the second transmission transistor, and the second driving transistor is configured to share a diffusion layer with the first transmission transistor, the diffusion layer being configured to serve as the drains of the second driving transistor and the first transmission transistor.

15. The semiconductor memory device of claim 14, wherein a gate electrode of the first transmission transistor and a gate electrode of the first read-only transmission transistor are positioned on straight lines different from each other, and a gate electrode of the second transmission transistor and a gate electrode of the second read-only transmission transistor are positioned on straight lines different from each other.

16. The semiconductor memory device of claim 15, wherein the first gate electrode and the gate electrode of the first transmission transistor are aligned in a longitudinal direction along a first straight line, the second gate electrode and the gate electrode of the second transmission transistor are aligned in a longitudinal direction along a second straight line parallel to the first straight line, and the gate electrode of the first read-only transmission transistor and the gate electrode of the second read-only transmission transistor are aligned in a longitudinal direction along a third straight line parallel to and between the first straight line and the second straight line.

17. The semiconductor memory device of claim 14, wherein the first gate electrode, the gate electrode of the first transmission transistor, and the gate electrode of the first read-only transmission transistor are aligned in a longitudinal direction along a first straight line, and the second gate electrode, the gate electrode of the second transmission transistor, and the gate electrode of the second read-only transmission transistor are aligned in a longitudinal direction along a second straight line parallel to the first straight line.

18. The semiconductor memory device of claim 15, wherein the first gate electrode and the gate electrode of the first read-only transmission transistor are aligned in a longitudinal direction along a first straight line, the second gate electrode and the gate electrode of the second read-only transmission transistor are aligned in a longitudinal direction along a second straight line parallel to the first straight line, and the gate electrode of the first transmission transistor and the gate electrode of the second transmission transistor are aligned in a longitudinal direction along a third straight line parallel to and between the first straight line and the second straight line.

19. The semiconductor memory device of claim 12, further comprising:

a first gate electrode shared by the gate of the first driving transistor and the gate of the first load transistor; and a second gate electrode shared by the gate of the second driving transistor and the gate of the second load transistor.

20. The semiconductor memory device of claim 19, wherein the first gate electrode, the gate electrode of the first transmission transistor, and the gate electrode of the first read-only transmission transistor are aligned in a longitudinal direction along a first straight line, and the second gate electrode, the gate electrode of the second transmission transistor, and the gate electrode of the second read-only transmission transistor are aligned in a longitudinal direction along a second straight line parallel to the first straight line.

21. A semiconductor memory device, comprising:

a first driving transistor;

a second driving transistor;

a first load transistor connected in series with the first driving transistor;

a second load transistor connected in series with the second driving transistor;

a first transmission transistor comprising a drain connected to a gate of the first driving transistor, a gate of the first load transistor, a drain of the second driving transistor, and a drain of the second load transistor;

a second transmission transistor comprising a drain connected to a drain of the first driving transistor, a drain of the first load transistor, a gate of the second driving transistor, and a gate of the second load transistor;

a first read-only transmission transistor comprising a drain connected to the gate of the first driving transistor, the gate of the first load transistor, the drain of the second driving transistor, and the drain of the second load transistor;

a second read-only transmission transistor comprising a drain connected to the drain of the first driving transistor, the drain of the first load transistor, the gate of the second driving transistor, and the gate of the second load transistor;

a writing word line connected to the gate of the first transmission transistor and the gate of the second transmission transistor;

a first reading word line connected to the gate of the first read-only transmission transistor;

a second reading word line connected to the gate of the second read-only transmission transistor;

a first writing bit line connected to a source of the first transmission transistor;

a second writing bit line connected to a source of the second transmission transistor;

a first reading bit line connected to a source of the first read-only transmission transistor; and a second reading bit line connected to a source of the second read-only transmission transistor, wherein the first reading word line is independent of the second reading word line.

* * * * *